United States Patent
Buliga

(10) Patent No.: US 10,680,623 B2
(45) Date of Patent: Jun. 9, 2020

(54) SYSTEM FOR COHERENT DISTRIBUTION OF OSCILLATOR SIGNAL

(71) Applicant: Andrei Buliga, Ottawa (CA)

(72) Inventor: Andrei Buliga, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 51 days.

(21) Appl. No.: 15/955,438

(22) Filed: Apr. 17, 2018

(65) Prior Publication Data
US 2019/0319631 A1 Oct. 17, 2019

(51) Int. Cl.
| | | |
|---|---|---|
| H04W 56/00 | (2009.01) | |
| H03L 7/093 | (2006.01) | |
| H04B 7/12 | (2006.01) | |
| H04B 7/06 | (2006.01) | |
| H04B 7/0417 | (2017.01) | |

(52) U.S. Cl.
CPC ........... *H03L 7/093* (2013.01); *H04B 7/0417* (2013.01); *H04B 7/0617* (2013.01); *H04B 7/12* (2013.01)

(58) Field of Classification Search
CPC ..... H03L 7/093; H04B 7/0417; H04B 7/0617; H04B 7/12
USPC .......................................................... 370/281
See application file for complete search history.

(56) References Cited

U.S. PATENT DOCUMENTS

| | | | | |
|---|---|---|---|---|
| 6,307,411 B1 * | 10/2001 | Kerner | ................... | H03L 7/087 327/156 |
| 6,867,616 B1 * | 3/2005 | Venkata | ........... | H03K 19/17736 326/41 |
| 2005/0064892 A1 * | 3/2005 | Cavin | ........................ | H03L 7/07 455/550.1 |
| 2006/0152293 A1 * | 7/2006 | McCorquodale | .......... | G06F 1/04 331/74 |
| 2009/0174486 A1 * | 7/2009 | Haralabidis | ............ | H03B 21/01 331/45 |
| 2009/0300240 A1 * | 12/2009 | Rofougaran | .......... | G06F 1/1632 710/65 |
| 2011/0267854 A1 * | 11/2011 | Flannery | ............... | H02M 7/493 363/72 |

(Continued)

FOREIGN PATENT DOCUMENTS

WO 2016202368 A1 12/2016

OTHER PUBLICATIONS

Arun Natarajan et al., "Frequency Synthesis and Clock Distribution Techniques for Phased-Array Technology and Massive MIMO", (School of EECS, Oregon State University), IMS, Jun. 2017.

(Continued)

*Primary Examiner* — Sai Ming Chan

(57) ABSTRACT

A local oscillator (LO) distribution system is described. The LO system includes a plurality of phase-locked loop (PLL) modules coupled to each other in a one-way, circulant coupling topology. Each PLL module receives a reference clock signal and outputs an output LO signal. Each PLL module provides a local LO signal to an adjacent downstream PLL module, where the local LO signal is a frequency divided version of the output LO signal. Each PLL module receives an adjacent LO signal from the adjacent upstream PLL module. The phase of the output LO signal is made to be coherent with the phase of the reference clock signal and the phase of the adjacent LO signal, using a feedback loop.

20 Claims, 10 Drawing Sheets

(56) References Cited

U.S. PATENT DOCUMENTS

| | | | |
|---|---|---|---|
| 2013/0077734 A1* | 3/2013 | Karalar | H03K 23/665 377/46 |
| 2013/0271229 A1 | 10/2013 | Gao et al. | |
| 2015/0036562 A1 | 2/2015 | Sturkovich et al. | |
| 2017/0324419 A1 | 11/2017 | Mayer et al. | |

OTHER PUBLICATIONS

Heng-Chia Chang et al., "Phase Noise in Coupled Oscillators: Theory and Experiment", IEEE Transactions on Microwave Theory and Techniques, vol. 45, No. 5, pp. 604-615, May 1997.
G. Clifford Carter, "Coherence and Time Delay Estimation", Proceedings of the IEEE, vol. 75, No. 2, pp. 236-255, Feb. 1987.
David Ramirez et al., "A Generalization of the Magnitude Squared Coherence Spectrum for More Than Two Signals: Definition, Properties and Estimation", IEEE International Conference on Acoustics, Speech and Signal Processing, ICASSP 2008.
Robert Adler, "A Study of Locking Phenomena in Oscillators", Proceedings of the IEEE, vol. 61, No. 10, pp. 1380-1385, Oct. 1973.
R. A. York, "Nonlinear Analysis of Phase Relationships in Quasi-Optical Oscillator Arrays", IEEE Transactions on Microwave Theory and Techniques, vol. 41, No. 10, pp. 1799-1809, Oct. 1993.
https://en.wikipedia.org/wiki/Circulant_matrix.
Silvia Noschese et al. "Tridiagonal Toeplitz Matrices: Properties and Novel Applications", www.math.kent.edu/~reichel/publications/toep3.pdf.
Junghyun Kim et al., "Improvement of Noise Performance in Phased-Array Receivers", ETRI Journal, vol. 33, No. 2, pp. 176-183, Apr. 2011.

* cited by examiner

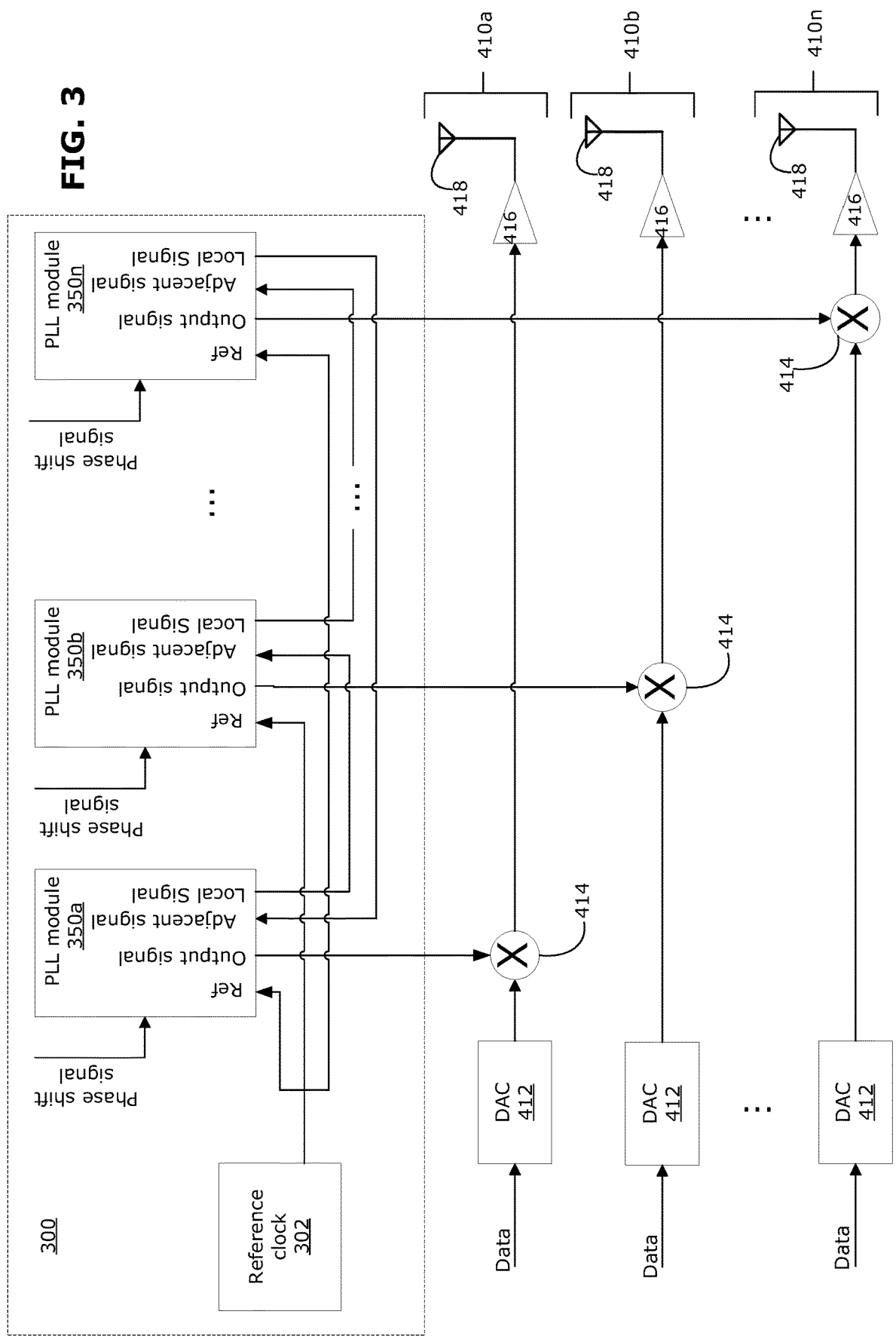

SYSTEM FOR COHERENT DISTRIBUTION OF OSCILLATOR SIGNAL

FIELD

The present disclosure is related to systems for distribution of a local oscillator (LO) signal, including LO distribution systems for multiple-input multiple-output (MIMO) systems and for phased array applications.

BACKGROUND

In multiple-input multiple-output (MIMO) systems (including massive MIMO systems), it is desirable to have coherently driven antennas with closely controlled phases and delays between antennas. Similarly, coherency among individual antennas of an antenna array is desirable for beamforming and beam steering. Generally, coherency means that in a system of multiple antenna branches, there is a defined phase-coherent relationship between the branches. Any loss of coherence (e.g., due to noise and/or distortion) erodes the system's ability to separate signal modes (e.g., in a MIMO system) or form beams (e.g., in an antenna array) because antenna signals become smeared over space and time.

A challenge in achieving a coherent system is the complexity of generating and distributing the local oscillator (LO) signals that are used for frequency conversion in the antenna branches, particularly in microwave and high frequency ranges. A conventional approach for distributing an LO signal among multiple antenna branches is to use metallic transmission lines to distribute the LO signals. However, such transmission lines exhibit significant loss at microwave and higher frequencies, thus needing more signal amplification and resulting in higher noise, greater distortion, higher power consumption and increased costs. Other conventional approaches may use lower-loss waveguides or optical fibers, however such approaches are expensive to manufacture and have difficulty in achieving phase and delay matching at shorter wavelengths.

It would be useful to provide a system for distributing LO signals over multiple antenna branches, which addresses the problems of excessive losses and/or distortion, particularly for higher frequencies.

SUMMARY

In various examples disclosed herein, a system for coherent distribution of local oscillator (LO) signals is described. The system uses a plurality of coupled phased-lock loop (PLL) modules, where the PLL modules are coupled to each other in a one-way, circulant coupling topology.

In some aspects, the present disclosure describes a system for distribution of an LO signal. The system includes a plurality of PLL modules coupled to each other in a one-way, circulant coupling topology. Each PLL module is coupled to receive signals from an adjacent upstream PLL module and to provide signals to an adjacent downstream PLL module. Each PLL module is configured to receive a reference clock signal and output an output LO signal. Each PLL module is also configured to provide a local LO signal to the adjacent downstream PLL module in the circulant coupling topology, the local LO signal being a frequency divided version of the output LO signal. Each PLL module is also configured to receive an adjacent LO signal from the adjacent upstream PLL module in the circulant coupling topology. Each PLL module is also configured to cause a phase of the output LO signal to be coherent with a phase of the reference clock signal and a phase of the adjacent LO signal, using a feedback loop.

In any of the above aspects/embodiments, the system may also include a reference clock source for providing the reference clock signal.

In any of the above aspects/embodiments, at least one PLL module may be further configured to: receive a phase shift signal indicating an additional phase shift; and output the output LO signal with the additional phase shift applied.

In any of the above aspects/embodiments, each PLL module may also include: a first phase detector for generating a first error signal representing a first phase difference between the reference clock signal and the local LO signal; a second phase detector for generating a second error signal representing a second phase difference between the adjacent LO signal and the local LO signal; and an oscillator for generating the output LO signal, based on the first and second phase error signals.

In any of the above aspects/embodiments, each PLL module may also include: a charge pump for receiving a sum of the first and second phase error signals and outputting a charge pump output; and a low-pass filter for receiving the charge pump output and outputting an oscillator control signal to the oscillator.

In any of the above aspects/embodiments, the oscillator may be a voltage-controlled oscillator.

In any of the above aspects/embodiments, each PLL module may also include a frequency divider in the feedback loop, the frequency divider dividing a frequency of the output LO signal to generate the local LO signal that is fed back.

In some aspects, the present disclosure describes a wireless communication device including a plurality of antennas and a plurality of antenna branches for each respective antenna. Each antenna branch is configured to: receive a respective first signal; and mix the respective first signal with a respective LO signal to generate a respective second signal. The wireless communication device also includes an LO distribution system for providing the LO signals to the antenna branches. The LO distribution system includes a plurality of PLL modules coupled to each other in a one-way, circulant coupling topology. Each PLL module is coupled to receive signals from an adjacent upstream PLL module and to provide signals to an adjacent downstream PLL module. Each PLL module provides a respective one of the LO signals. Each PLL module is configured to receive a reference clock signal and output the respective LO signal. Each PLL module is also configured to provide a local LO signal to the adjacent downstream PLL module in the circulant coupling topology. The local LO signal is a frequency divided version of the respective LO signal. Each PLL module is also configured to receive an adjacent LO signal from the adjacent upstream PLL module in the circulant coupling topology. Each PLL module is also configured to cause a phase of the respective LO signal to be coherent with a phase of the reference clock signal and a phase of the adjacent LO signal, using a feedback loop.

In any of the above aspects/embodiments, the plurality of antenna branches may be operating in transmitting mode. The respective first signal may be a respective intermediate frequency (IF) signal and the respective second signal may be a respective carrier signal. Each antenna branch may be further configured to provide the respective carrier signal to the respective antenna for transmission.

In any of the above aspects/embodiments, the plurality of antenna branches may be operating in receiving mode. The respective first signal may be a respective carrier signal and the respective second signal may be a respective IF signal. Each antenna branch may be further configured to receive the respective carrier signal from the respective antenna.

In any of the above aspects/embodiments, the LO distribution system may include a reference clock source for providing the reference clock signal.

In any of the above aspects/embodiments, at least one PLL module of the LO distribution system may be further configured to: receive a phase shift signal indicating an additional phase shift; and output the respective LO signal with the additional phase shift applied.

In any of the above aspects/embodiments, the wireless communication device may also include a processor configured to provide the phase shift signal to the LO distribution system.

In any of the above aspects/embodiments, the plurality of antennas may form an antenna array. Each PLL module of the LO distribution system may receive a respective phase shift signal indicating a respective additional phase shift, and the respective additional phase shifts may be used for beamforming or beam steering by the antenna array.

In any of the above aspects/embodiments, each PLL module may include: a first phase detector for generating a first error signal representing a first phase difference between the reference clock signal and the local LO signal; a second phase detector for generating a second error signal representing a second phase difference between the adjacent LO signal and the local LO signal; and an oscillator for generating the respective LO signal, based on the first and second phase error signals.

In any of the above aspects/embodiments, each PLL module may include: a charge pump for receiving a sum of the first and second phase error signals and outputting a charge pump output; and a low-pass filter for receiving the charge pump output and outputting an oscillator control signal to the oscillator.

In any of the above aspects/embodiments, the oscillator may be a voltage-controlled oscillator.

In any of the above aspects/embodiments, each PLL module may include a frequency divider in the feedback loop, the frequency divider dividing a frequency of the respective LO signal to generate the local LO signal that is fed back.

In any of the above aspects/embodiments, the plurality of antennas may be configured for multiple-input multiple-output (MIMO) communications.

In any of the above aspects/embodiments, the plurality of antennas may be configured for millimeter wave communications.

BRIEF DESCRIPTION OF THE DRAWINGS

Reference will now be made, by way of example, to the accompanying drawings which show example embodiments of the present application, and in which:

FIG. 3 is a schematic diagram of an example disclosed system for distribution of LO signals;

Similar reference numerals may have been used in different figures to denote similar components.

DESCRIPTION OF EXAMPLE EMBODIMENTS

An example system for distributing local oscillator (LO) signals for multiple antenna branches is discussed below. The disclosed system requires distribution of only low-frequency signals (e.g., clock-like signals), which may help to avoid difficulties of LO distribution at microwave or higher frequencies. The disclosed system provides phase and frequency coherency among the outputted LO signals, using one-way, circulant coupling of phase-locked loop (PLL) modules. The PLL modules may be coupled to each other at low frequencies. In the disclosed circuit, the PLL modules are placed close to the mixers on the antenna branches, thus avoiding the use of millimeter-wave (mm-Wave) routings. The disclosed system may be readily scalable to large numbers of antenna branches. The LO distribution system may include different circuits, as described further below. The LO distribution system may be used for distribution of LO signals within communication devices, including wireless communication devices operating in a wireless network system.

Figure 1:
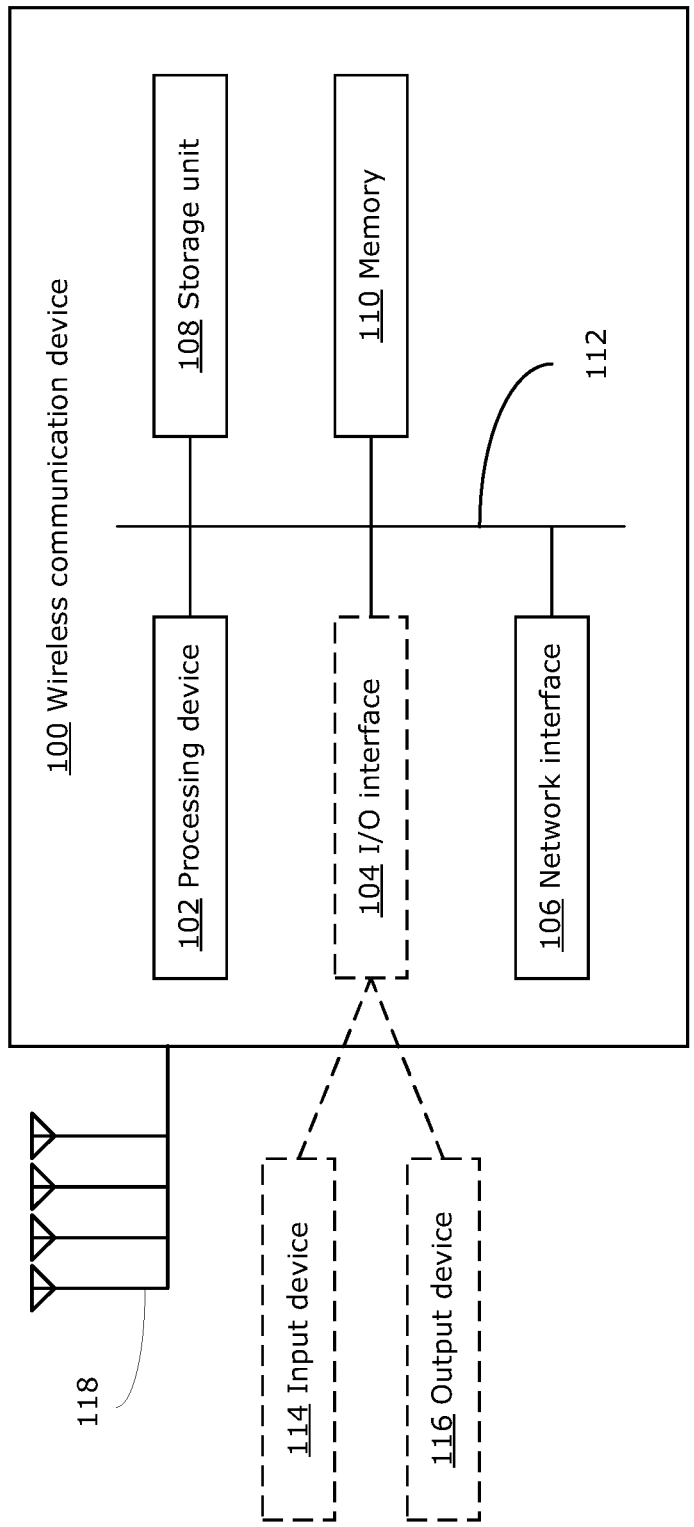
FIG. 1 is a schematic diagram of an example wireless communication device in which an example of the disclosed LO distribution system may be implemented.

FIG. 1 is a schematic diagram of an example wireless communication device 100 in which the disclosed LO distribution system, or variations thereof, may be implemented. Other communication devices may be suitable for implementing embodiments described in the present disclosure, and may include components different from those discussed below. In some examples, the disclosed LO distribution system may be implemented in devices capable of wired and/or wireless communication. Although FIG. 1 shows a single instance of each component, there may be multiple instances of each component in the wireless communication device 100. The wireless communication device 100 may be any entity capable of wireless communications in a wireless communications network. For example, the wireless communication device 100 may be a wireless access point (AP) (which may also be referred to as a base station, evolved NodeB (eNB) or distribution node) or may be a user equipment (UE) (which may also be referred to as a station, user device, client or terminal).

The wireless communication device 100 may include one or more processing devices 102, such as a processor, a microprocessor, an application-specific integrated circuit (ASIC), a field-programmable gate array (FPGA), a dedicated logic circuitry, or combinations thereof. The wireless communication device 100 may optionally include one or more input/output (I/O) interfaces 104, to enable interfacing with one or more optional input devices 114 and/or output devices 116. The wireless communication device 100 may include one or more network interfaces 106 for wired or wireless communication with a network (e.g., an intranet, the Internet, a P2P network, a WAN and/or a LAN) or other node. The network interface(s) 106 may include wired links and/or wireless links for intra-network and/or inter-network communications.

The network interface(s) 106 may provide wireless communication via a plurality of antennas 118, which may perform both transmitting and receiving functions. For example, multiple antennas 118 may be used for multiple-input multiple-output (MIMO) communications (including massive MIMO communications) by the wireless communication device 100. The antennas 118 may together form an antenna array. The antenna array (which may also be referred to as a phased array) may enable directional communications using beamforming and beam steering. The antennas 118 may be configured for communication in microwave or higher frequencies, for example using millimeter wave communications. In other examples there may be separate antennas or separate antenna arrays for transmitting and receiving.

The wireless communication device 100 may also include one or more storage units 108, which may include a mass storage unit such as a solid state drive, a hard disk drive, a magnetic disk drive and/or an optical disk drive. The wireless communication device 100 may include one or more memories 110, which may include a volatile or non-volatile memory (e.g., a flash memory, a random access memory (RAM), and/or a read-only memory (ROM)). The non-transitory memory(ies) 110 may store instructions for execution by the processing device(s) 102, such as to cause the processing device(s) 102 to generate signals to the disclosed LO distribution system and/or generate signals to be transmitted by the antennas 118. The memory(ies) 110 may include other software instructions, such as for implementing an operating system and other applications/functions. In some examples, one or more data sets and/or modules may be provided by an external memory (e.g., an external drive in wired or wireless communication with the wireless communication device 100) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 112 providing communication among components of the wireless communication device 100, including the processing device(s) 102, optional I/O interface(s) 104, network interface(s) 106, storage unit(s) 108 and/or memory(ies) 110. The bus 112 may be any suitable bus architecture including, for example, a memory bus, a peripheral bus or a video bus.

In FIG. 1, the optional input device(s) 114 (e.g., a keyboard, a mouse, a microphone, a touchscreen, and/or a keypad) and optional output device(s) 116 (e.g., a display, a speaker and/or a printer) are shown as external to the wireless communication device 100. In other examples, one or more of the input device(s) 114 and/or the output device(s) 116 may an internal component of the wireless communication device 100.

As described above, the wireless communication device 100 may use a plurality of antennas 118 (e.g., for MIMO communications and/or forming an antenna array). Operation of the multi-antenna device requires the signals sent to each antenna to be coherent. Two signals are considered to be coherent if they have a substantially constant relative phase (but not necessarily zero phase difference) at all instances in time. It is not sufficient for the two signals to have the same frequency. In some cases, two signals may be considered to be coherent even if there are small inconsistencies in their relative phase. For example, coherency of two signals may be measured as a statistical property, such as magnitude-squared coherence (MSC), and two signals may be considered to be coherent if the statistical property satisfies a predefined threshold (e.g., MSC≥0.95, for 95% of the time). A challenge in multi-antenna devices is that systems for distributing LO signals to the multiple antenna branches may cause a loss of coherence.

Figure 2A:
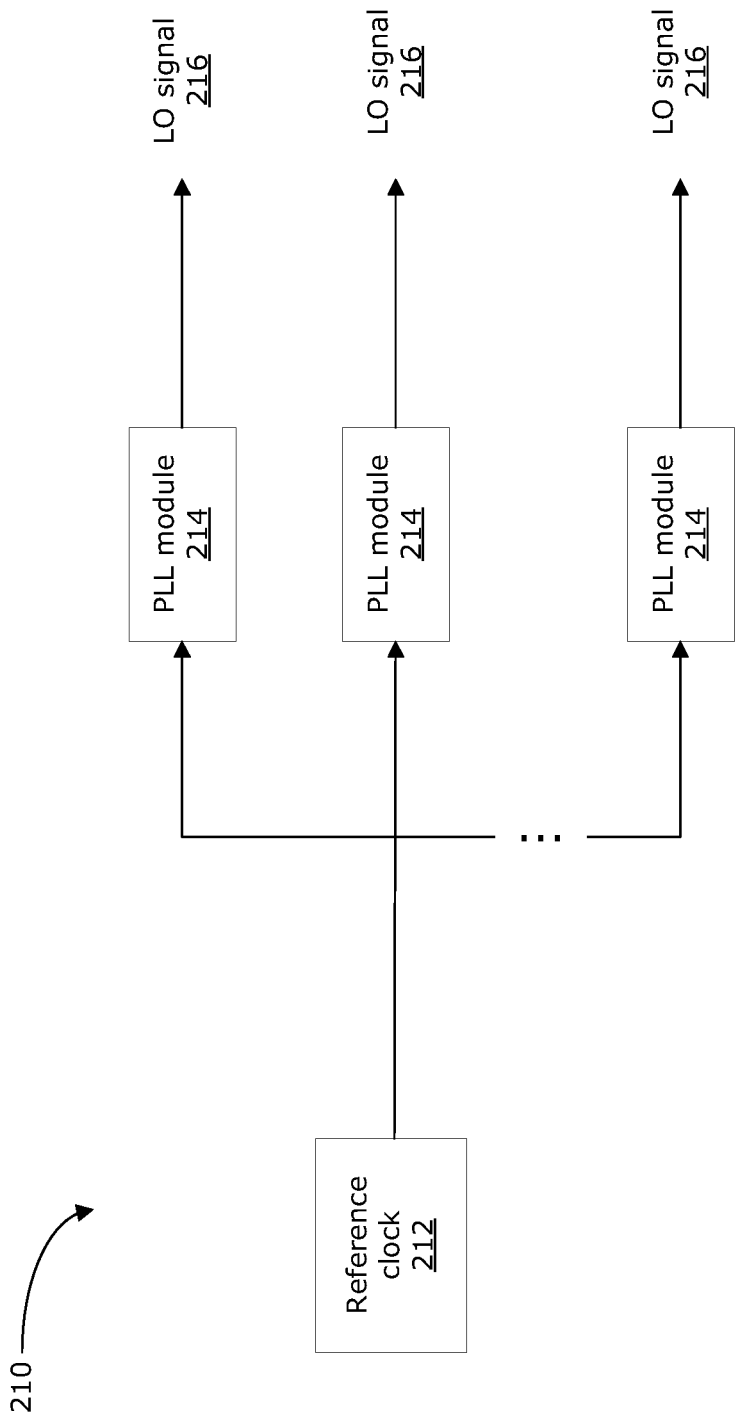
FIGS. 2A and 2B are a schematic diagrams of example conventional systems for distribution of LO signals.

FIG. 2A is a schematic diagram of an example conventional system 210 for distribution of LO signals. The conventional system 210 uses a clock distribution approach, in which a source of a low-frequency reference clock signal (e.g., reference clock 212) generates a reference clock signal that is distributed among the branches. Each branch includes a PLL module 214 (which may also be referred to simply as a PLL, or as a frequency synthesizer). In each PLL module 214, an independent PLL locks a voltage-controlled oscillator (VCO) to the reference clock signal. Thus, each PLL module 214 operates entirely independently of each other PLL module 214. Even if each PLL module 214 has identical circuitry, there are inherent variations in circuit components. For example, the VCOs in each PLL module 214 typically each exhibit independent phase noise and phase offset characteristics. Accordingly, the phase noise and phase errors of the outputted LO signals 216 are incoherent and uncontrolled. The system 210 therefore is not suitable for distributing LO signals to antenna branches of a multi-antenna device.

Figure 2B:
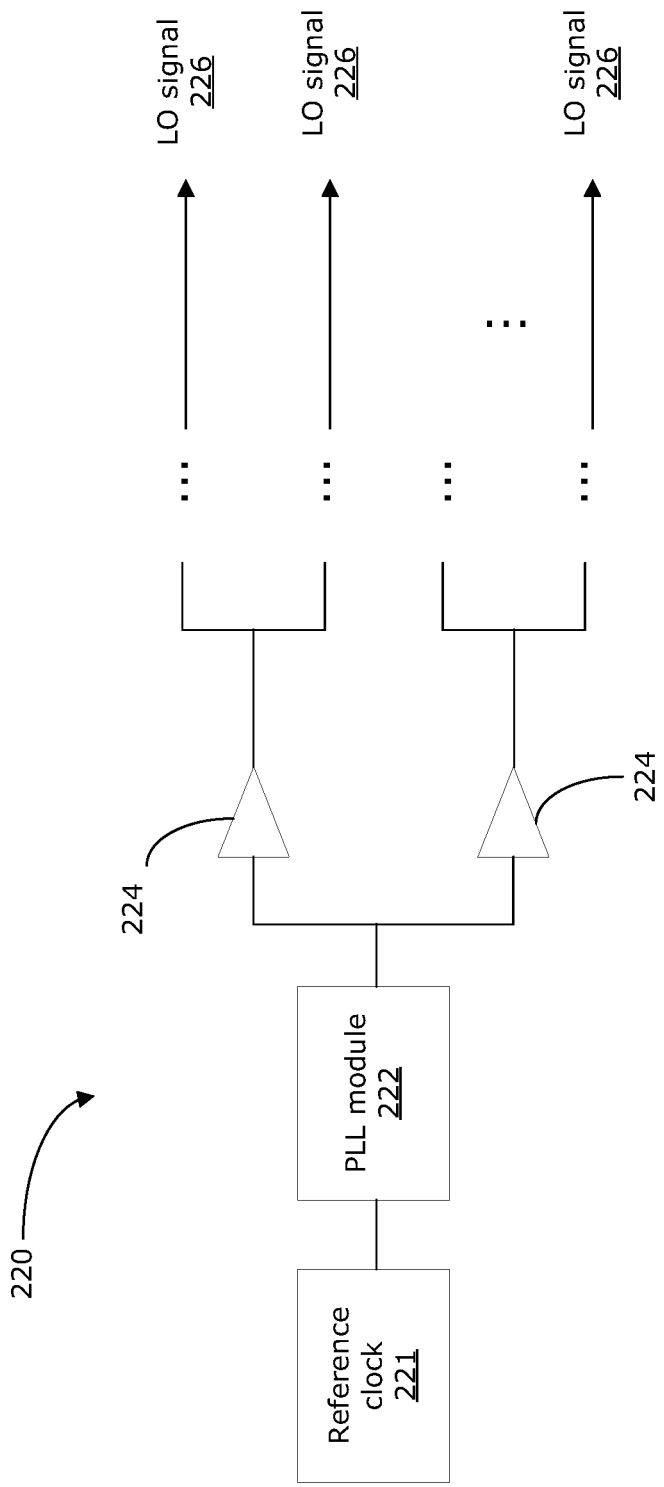

FIG. 2B is a schematic diagram of another example system 220 for distribution of LO signals. In this example, the reference clock signal (e.g., from a reference clock 221) is provided to a single PLL module 222, and the output from the single PLL module 222 is split among multiple branches to output the multiple LO signals 226. Amplifiers 224 are used to amplify the split signals. In this example, there is a loss of coherence in LO signals 226 at higher frequencies due to losses in transmission lines, amplifier distortions and/or phase and time delay differences among the transmission lines. Therefore, the system 220 also is not suitable for distributing LO signals to antenna branches of a multi-antenna device, particularly at higher frequencies (e.g., microwave or higher frequencies).

An approach to achieve greater coherence among the distributed LO signals is to introduce coupling among the PLL modules. However, previous attempts, such as described by Natarajan et al. ("Frequency Synthesis and Clock Distribution Techniques for Phased array Technology and Massive MIMO" IMS, June 2017; which uses non-circulant bidirectional coupling between nearest neighbor PLL modules only), have provided only small improvements and/or are expensive to implement (e.g., requiring three phase detectors in each PLL module in the approach described by Natarajan et al.).

FIG. 3 is a schematic diagram of an example disclosed system 300 for distribution of LO signals. The example system 300 outputs LO signals that may be used for frequency conversion of signals on the antenna branches of a multi-antenna device (e.g., a wireless communication device 100 for massive MIMO communications and/or having an antenna array). The disclosed LO distribution system 300 uses a coupled-PLL technique in order to achieve frequency and phase coherence, so that the LO signal distributed to each antenna branch is locked to the same reference frequency with phase coherence. As will be discussed further below, the disclosed system 300 uses PLL modules that are coupled to each other in a unidirectional, closed-loop topology. The result is an LO distribution system 300 that is robust against some common circuit impairments (e.g., noise effects or component mismatches). Mathematically, the PLL modules are coupled to each other via a one-way, circulant coupling matrix. Accordingly, the PLL modules may also be referred to as being coupled to each other in a one-way, circulant coupling topology.

In FIG. 3, antenna branches 410a to 410n (generally referred to as antenna branch 410) are shown, however it should be understood that antenna branches 410 are not necessarily part of the LO distribution system 300. For example, the disclosed LO distribution system 300 may be formed by the components identified in the dashed box in FIG. 3. In FIG. 3, the antenna branches 410 are illustrated for operation in the transmitting mode. It should be understood that the disclosed LO distribution system 300 can be also used for distributing LO signals to antenna branches 410 operating in the receiving mode. In FIG. 3, each antenna branch 410 receives an intermediate frequency (IF) signal to be transmitted. The IF signal may be the result of converting a digital data signal to an analog IF signal, using a digital-to-analog converter (DAC) 412. Frequency conversion is performed (e.g., using a mixer 414) by mixing the IF signal with an LO signal (provided by the LO distribution system 300), to obtain a carrier signal. The carrier signal may be amplified by an amplifier 416 before being provided to the antenna 418 for transmission. In the case where the antenna branches 410 are operating in the receiving mode, each antenna 418 receives a carrier signal that is mixed with the LO signal (provided by the LO distribution system 300) to generate an IF signal. Regardless of whether the antenna branches are operating in transmitting or receiving mode, phase coherence of the LO signals used for frequency conversion on the respective antenna branches 410 is desirable. The disclosed LO distribution system 300 provides phase coherent LO signals to the antenna branches 410, as discussed below. For simplicity, the following description refers to the antenna branches 410 operating in transmitting mode, however this is not intended to be limiting.

In the disclosed LO distribution system 300, a reference clock signal is provided by a reference clock source 302 (also referred to simply as reference clock 302). Although FIG. 3 illustrates the reference clock 302 as being part of the LO distribution system 300, in some examples, the reference clock 302 may be external to the system 300. For example, the reference clock signal may be a clock signal provided by a processing device 102 of the wireless communication device 100 (see FIG. 1). The reference clock signal is received by each of a plurality of PLL modules 350a to 350n (generally referred to as PLL module 350). Each PLL module 350a to 350n outputs a respective output LO signal to be used for frequency conversion on a respective antenna branch 410a to 410n.

The PLL modules 350 are coupled to each other in a unidirectional, closed-loop topology, also referred to as a one-way, circulant coupling topology. A closed-loop or circulant coupling topology means that each PLL module 350 provides a signal to and receives a signal from immediately adjacent PLL modules 350 in the loop. A unidirectional or one-way topology means that each PLL module 350 provides a signal to one immediately adjacent PLL module 350 (also referred to as the adjacent downstream PLL module) and receives a signal from a different immediately adjacent PLL module 350 (also referred to as the adjacent upstream PLL module). For example, PLL module 350a provides a local LO signal to adjacent downstream PLL module 350b and receives an adjacent LO signal from adjacent upstream PLL module 350n; similarly, PLL module 350b provides a local LO signal to adjacent downstream PLL module 350c (not shown) and receives an adjacent LO signal from adjacent upstream PLL module 350a. The local LO signal outputted by PLL module 350a is received at PLL module 350b as the adjacent LO signal. The local LO signal outputted by a PLL module 350 is a frequency divided version of the output LO signal, as described further below. In each PLL module 350, a feedback loop is used to cause the phase of the output LO signal to be coherent with the phases of the reference clock signal and the adjacent LO signal. It should be noted that, when the phases of the output LO signal, reference clock signal and adjacent LO signal are coherent, this means that the relative phase differences between these signals are substantially constant, but not necessarily zero. For example, an additional phase shift may be applied to the output LO signal, as discussed further below.

Figure 4:
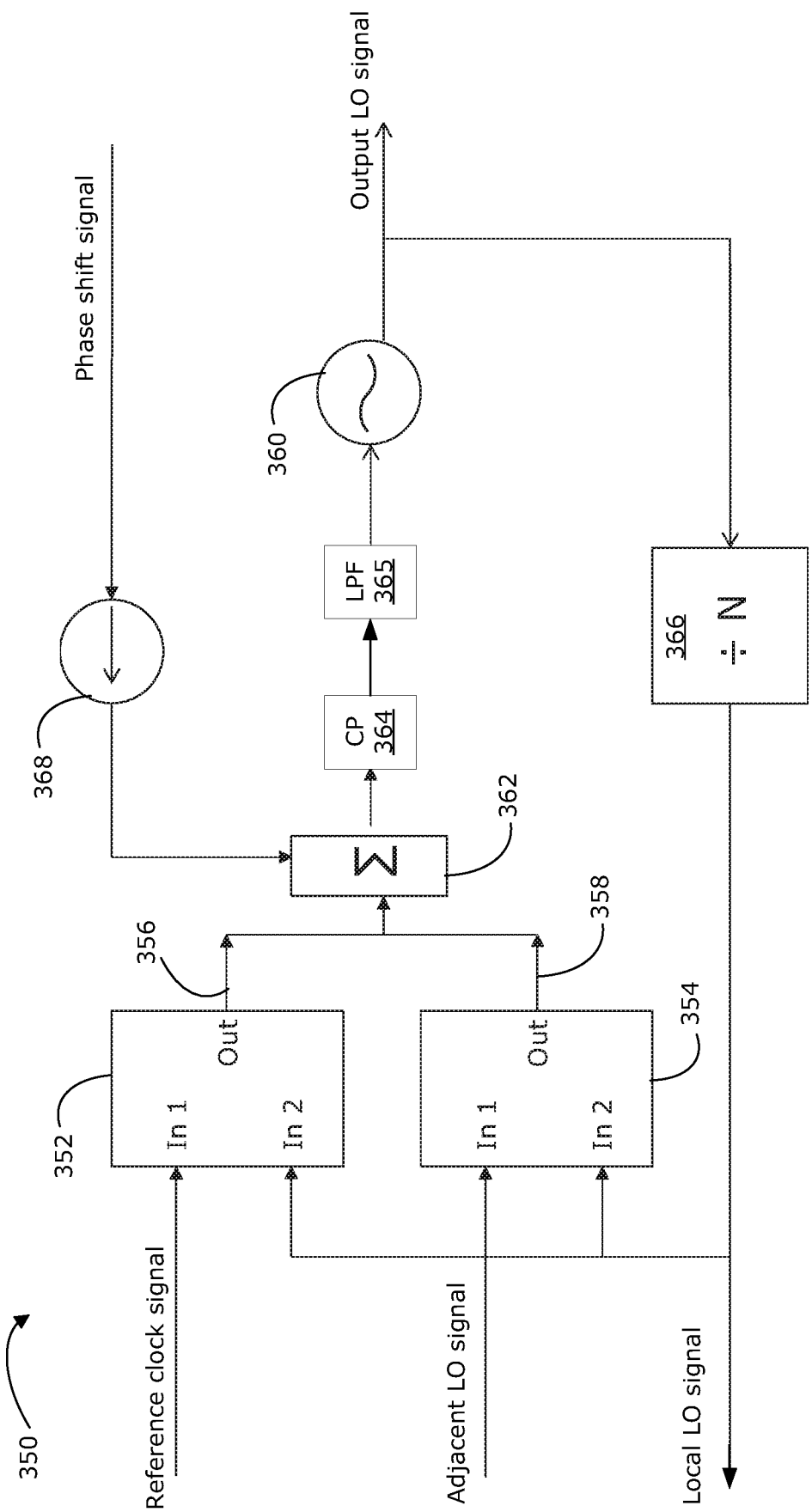
FIG. 4 is a schematic diagram showing components of an example PLL module suitable for use in the example system of FIG. 3.

FIG. 4 is a schematic diagram showing components of an example PLL module 350, including details of the feedback loop. The PLL module 350 includes a first phase detector 352 and a second phase detector 354. The first and second phase detectors 352, 354 may be any suitable type of phase detector, such as phase frequency detectors. Each phase detector 352, 354 receives two input signals (indicated as In 1 and In 2) and generates an output (indicated as Out) that represents the phase difference between the two input signals (e.g., the magnitude of the output may be proportional to the detected phase difference). The first phase detector 352 receives the reference clock signal and the local LO signal and outputs a first phase error signal 356. The first phase error signal 356 represents the phase difference between the reference clock signal and the local LO signal. The second phase detector 354 receives the adjacent LO signal and the local LO signal and outputs a second phase error signal 358. The second phase error signal 358 represents the phase difference between the adjacent LO signal and the local LO signal.

The first and second phase error signals 356, 358 are used to control an oscillator 360 (e.g., a voltage-controlled oscillator (VCO)) to generate the output LO signal. In the example shown, the first and second phase error signals 356, 358 are summed at a summing junction 362 and the sum is provided to a charge pump (CP) 364 and low-pass filter (LPF) 365. The LPF 365 may also be referred to as a loop filter. The CP 364 outputs a charge pump output, which is a current that is positive or negative depending on whether the summed error is positive or negative. The LPF 365 (which may be implemented as a simple resistor-capacitor (RC) passive filter) serves to average charge pump output, and may enable smoother tracking of the reference clock signal (e.g., by removing the effect of thermal noise). The output of the LPF 365 is provided as an oscillator control signal to the oscillator 360 (e.g., a control voltage to control the VCO). In an example, the oscillator 360 may be a VCO in which the frequency is increased with increasing voltage. Thus, when the sum of the first and second phase error signals 356, 358 is positive, the oscillator control signal serves to increase the frequency of the oscillator 360; and when the sum is negative, the oscillator control signal serves to decrease the frequency of the oscillator 360. In other examples, the oscillator 360 may operate opposite to that described above (i.e., the frequency is decreased with increasing voltage), and the PLL module 350 may be adjusted appropriately (e.g., the CP 364 may be an inverting CP). In this way, the output LO signal is adjusted according to the phases of the reference clock signal and the adjacent LO signal, to maintain phase coherence.

Although the CP 364 and LPF 365 are used in this example, other types of PLL modules that do not use a CP and/or do not use an LPF may be used to implement the system 300.

A frequency divider 366 may be provided in the feedback loop, such that the local LO signal that is fed back to the phase detectors 352, 354 is a frequency divided (e.g., by a desired division factor N) version of the output LO signal that is distributed to the antenna branches. In some examples, the frequency divider 366 may be a fractional divider. Notably, it is the lower frequency local LO signal that is provided to the adjacent downstream PLL module (considered to be the adjacent LO signal when received at the adjacent downstream PLL module), and the adjacent LO signal that is received from the adjacent upstream PLL module (considered to be the local LO signal when outputted at the adjacent upstream PLL module) is also a lower frequency signal. By using the frequency divider 366, a lower frequency version of the higher frequency output LO signal may be phase-locked to a lower frequency reference clock signal and a lower frequency adjacent LO signal. That is, the phase difference between the local LO signal and the reference clock signal, and the phase difference between the local LO signal and the adjacent LO signal may be determined at a lower frequency than the actual frequency of the output LO signal. In some cases, the local LO signal and the adjacent LO signal may be digital signals that are at a frequency that is close to the bandwidth limitation of the frequency divider 366. The signal outputted by the frequency divider 366 may thus appear similar to an analog or quasi-analog signal. This may help to improve frequency stability, and reduce noise contribution.

Optionally, such as in the example shown in FIGS. 3 and 4, a PLL module 350 may also receive a phase shift signal that indicates an additional phase shift (e.g., up to 360° phase shift) to be applied to the output LO signal. The phase shift signal may be provided by a processing device 102 of the wireless communication device 100 (see FIG. 1), for example. A current source 368 may be used to convert the phase shift signal into a current that is summed with the error signals 356, 358 at the summing junction 362. The additional current from the phase shift signal is added to the summed error, causing additional phase shift to be applied to the output LO signal. The result is that the output from the PLL module 350 is an output LO signal that is coherent with the reference clock signal and the adjacent LO signal (that is, having a substantially constant relative phase) but with the additional phase shift applied. When the output LO signal is mixed with the IF signal on the antenna branch 410, the result is that the carrier signal provided to the antenna 418 has the additional phase shift.

In some examples, such as where the antennas 418 form an antenna array, each PLL module 350 may receive a respective phase shift signal indicating a respective additional phase shift. The additional phase shift applied to the output LO signal at each PLL module 350 may be different and/or may be independently controlled. For example, the additional phase shifts may be controlled for the purpose of beam steering and/or beamforming at the antennas. This may supplement or replace the use of analog phase shifters on each antenna branch. By applying the additional phase shift at the PLL modules 350, and omitting analog phase shifters, cost and/or size savings may be achieved.

In some examples, the phase shift signal and current source 368 may be omitted. For example, additional phase shift may be provided using analog phase shifters instead, or additional phase shift may not be needed.

The architecture of the disclosed LO distribution system 300 may be considered to be a modular topology, in which the number of PLL modules 350 may be as many or as few as desired. For example, the number of PLL modules 350 that are coupled to each other in the one-way, circulant topology may be chosen based on the number of antenna branches 410 requiring an LO signal. Such a design may enable the disclosed system 300 to be scalable to provide LO signals to any number of antenna branches.

The disclosed LO distribution system provides improvements in phase coherence and phase noise, compared to conventional LO distribution approaches. Such improvements are discussed below.

Figure 5:
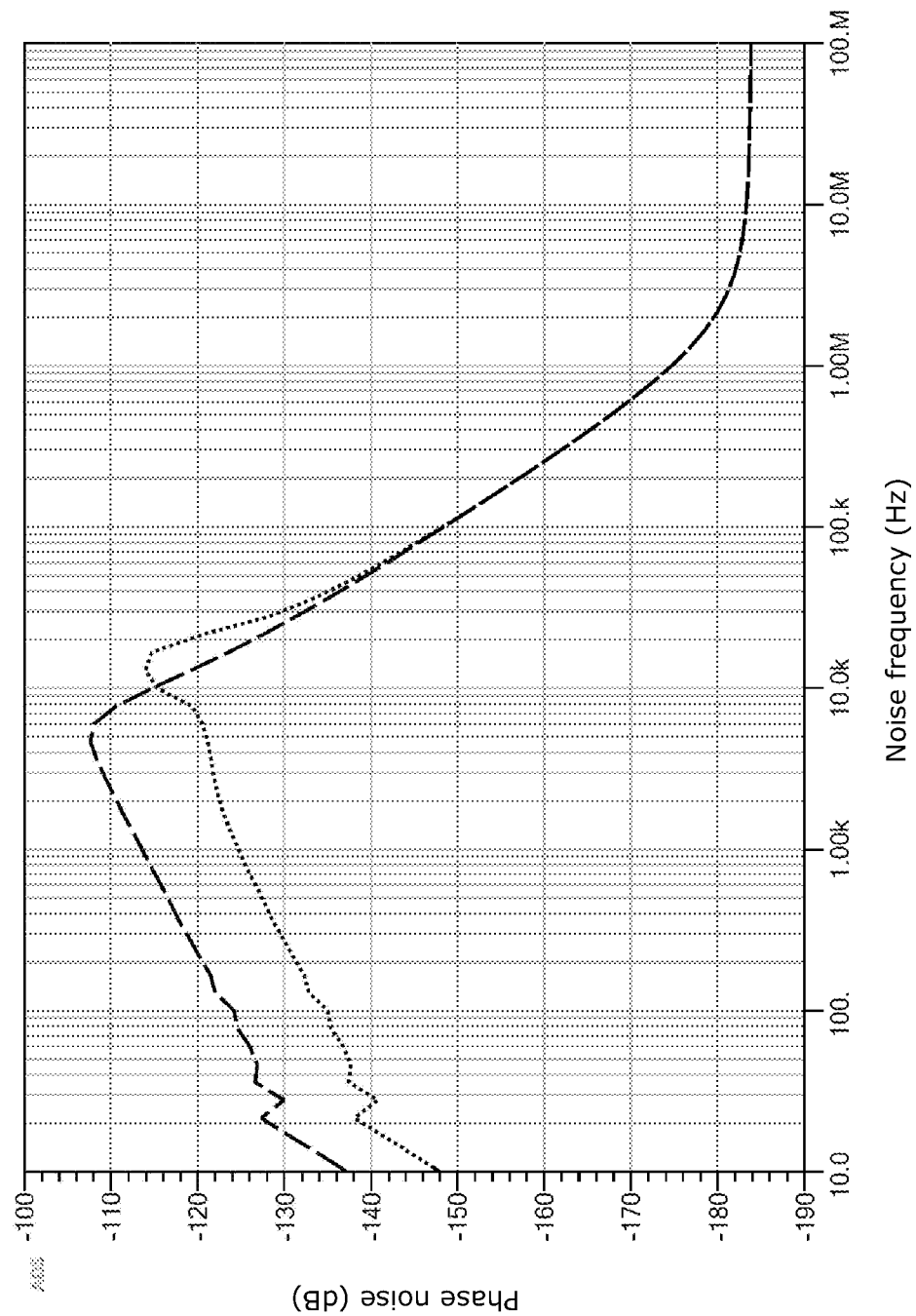
FIG. 5 is a chart showing example phase noise in an LO signal outputted from a single independent PLL module, compared to example phase noise an LO signal outputted from one of 12 coupled PLL modules.

FIG. 5 is a chart illustrating an improvement in phase noise when PLL modules are coupled together in the manner described above. FIG. 5 shows phase noise in an LO signal outputted by an example single independent PLL module (dashed line). Also shown is phase noise in an LO signal outputted by a PLL module that is one of 12 PLL modules coupled together in a one-way, circulant coupling topology, as described above (dotted line). As can be seen in FIG. 5, the coupled PLL module outputs an LO signal with phase noise that is up to 10 dB better than the single independent PLL module, close to the LO carrier and inside of the loop filter. The improvement in phase noise leads to better phase coherence in the LO signals outputted by each of the coupled PLL modules.

Figure 6A:
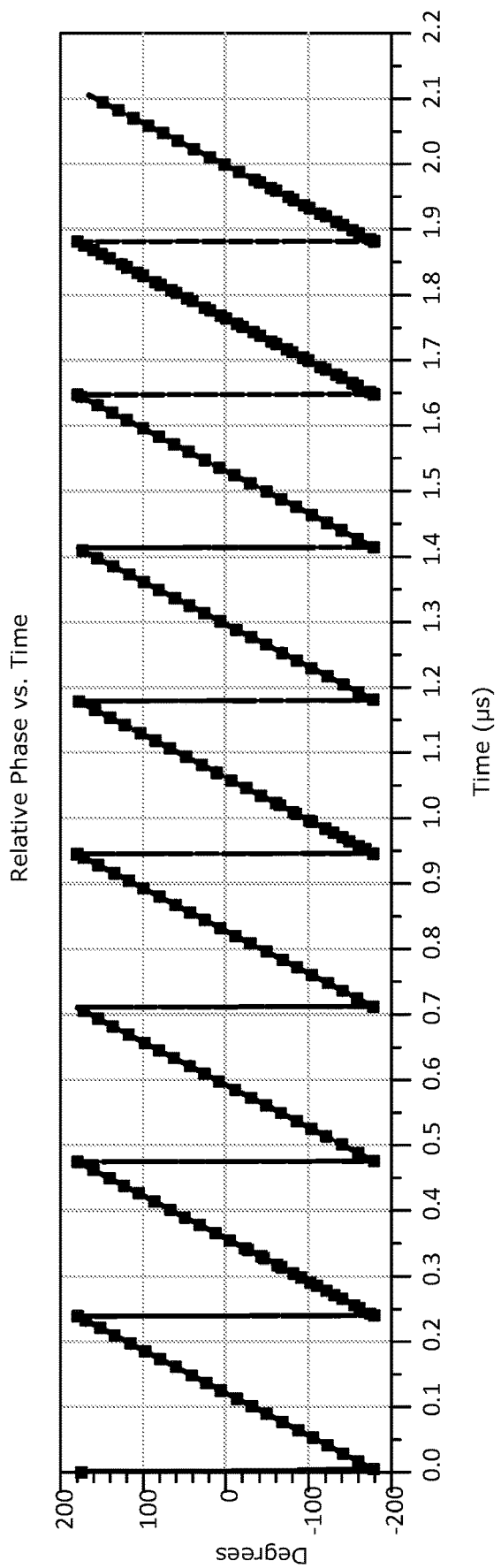
FIG. 6A is a chart showing the phase of simulated LO signals outputted by four PLL modules that are coupled together in a one-way, circulant coupling topology.
Figure 6B:
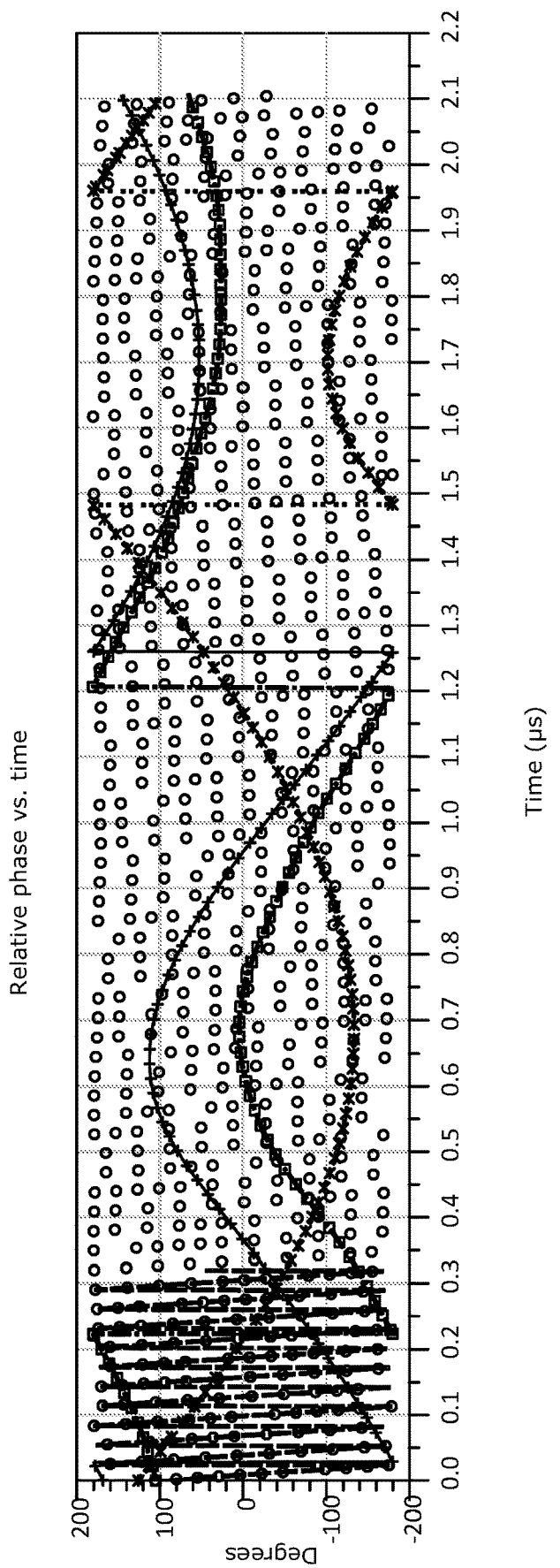
FIG. 6B is a chart showing the phase of simulated LO signals outputted by four PLL modules that are coupled to each other, but not in a circulant coupling topology.

FIG. 6A is a chart showing the phase of simulated LO signals outputted by four PLL modules that are coupled together in a one-way, circulant coupling topology, as in the disclosed LO distribution system. As can be seen in FIG. 6A, the LO signals exhibit phase coherence with each other. In comparison, FIG. 6B shows the phase of simulated LO signals outputted by four PLL modules (indicated by different symbols) that are coupled to each other, but not in a circulant coupling topology. In FIG. 6B, the circulant coupling has been "cut" at one point, by removing one connection providing a local LO signal from one PLL module to an adjacent downstream PLL module (e.g., removing the connection from the local signal of PLL module 350n to the adjacent signal of PLL module 350a in FIG. 3). As can be seen in FIG. 6B, this results in loss of phase coherence in the outputted LO signals. Thus, FIGS. 6A and 6B illustrate the advantage provided by the coupling of PLL modules in a one-way, circulant coupling topology, as disclosed.

Figure 7A:
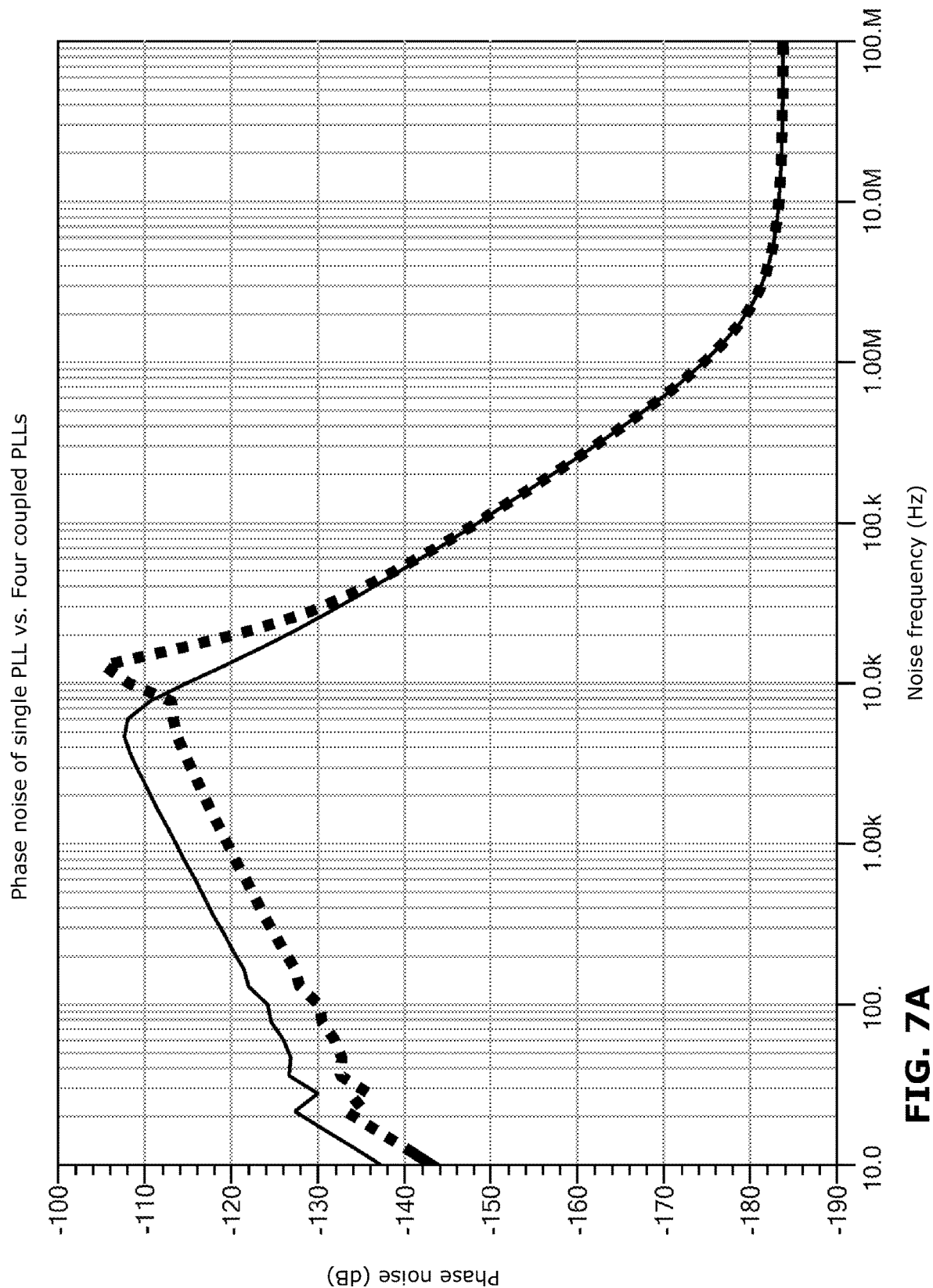
FIG. 7A is a chart showing the phase noise in a simulated LO signal outputted by a single PLL module, compared to the phase noise in simulated LO signals outputted by four PLL modules coupled together in a one-way, circulant coupling topology.
Figure 7B:
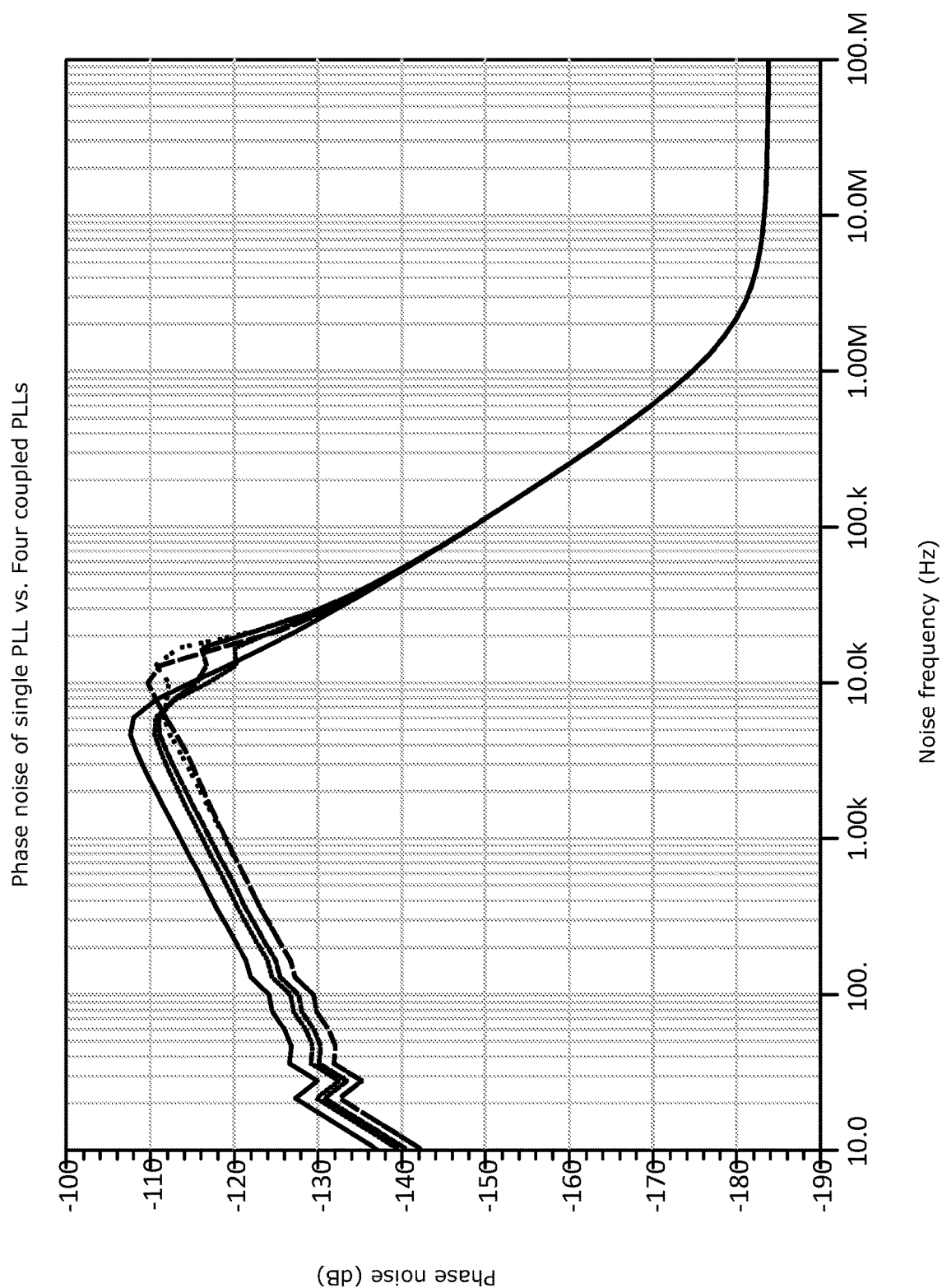
FIG. 7B is a chart showing the phase noise in a simulated LO signal outputted by a single PLL module, compared to the phase noise in simulated LO signals outputted by four PLL modules coupled together according to a previously attempted LO distribution approach.

FIG. 7A is a chart showing the phase noise in a simulated LO signal outputted by a single independent PLL module (solid line), compared to the phase noise in simulated LO signals outputted by PLL modules (dashed lines). In FIG. 7A, the phase noise is shown for the LO signals outputted by all four PLL modules that are coupled together in a one-way, circulant coupling topology. As can be seen in FIG. 7A, the phase noise plots for the four coupled PLL modules all overlap, meaning that the LO signals outputted by each of the coupled PLL modules all have substantially the same phase noise. Further, the phase noise in the LO signals outputted by the coupled PLL modules is about 5 dB lower than that outputted by the single independent PLL module. Generally, the phase noise improvement when using PLL modules coupled as disclosed, compared to a single independent PLL module, may be theoretically calculated to be 10 log(N), where N is the number of PLL modules coupled in the one-way, circulant coupling topology. For comparison, FIG. 7B shows the phase noise in simulated LO signals outputted by PLL modules that are coupled according to a previously attempted coupling topology described by previously-mentioned Natarajan et al. The simulated phase noise for a single independent PLL module is included as a solid line, for reference. The simulated phase noise for four PLL modules coupled using Natarajan et al.'s coupling topology is shown as dotted lines. As can be seen in FIG. 7B, the phase noise in the LO signals outputted by the PLL modules is not only worse (i.e., greater phase noise) compared to FIG. 7A, but the phase noise is also different among the LO signals, leading to loss of coherence.

The present disclosure describes an example system for distribution of an LO signal. The disclosed LO distribution system may help to improve phase coherence and/or reduce phase noise in LO distribution, including for massive MIMO and/or phased array devices, and including for high frequency (e.g., millimeter wave) communications. The disclosed system is robust against mismatches between VCOs and/or mismatches between VCOs and mixers, which may help to achieve highly stable and/or precise multi-antenna functions.

The disclosed LO distribution system may use fewer components, such as phase detectors, and fewer interconnections between PLL modules, compared to previously attempted LO distribution approaches (e.g., as described by Natarajan et al.). The disclosed LO distribution system may improve phase noise of all the LO signals, particularly close to the carrier frequency, such that the overall phase noise of combined signals at the multiple antennas may be lowered. In some examples, the disclosed LO distribution system may enable additional phase shifts to be applied to the LO signals (e.g., using a phase shift signal), which may enable analog phased array beamforming/beam steering without requiring the use of analog phase shifters. Such improvements may help to improve the performance of the wireless communication device. For example, the disclosed LO distribution system may help to reduce losses in signal path, decrease power consumption needs, decrease complexity and/or decrease cost of transceivers used in wireless communication devices.

The disclosed LO distribution system avoids the expense and complexity of conventional LO distribution approaches that use optical distribution of LO signals.

The disclosed LO distribution system enables the distribution of RF directly, meaning that each outputted LO signal can be outputted close to the mixer on the antenna branch and does not need to be distributed through the chip or circuit board. This may help to avoid corruption of the LO signal. Only low frequency signals (e.g., the reference clock signal and the divided frequency local LO signals) need to be distributed over a longer distance. Using low-frequency coupling at the PLL modules may also help to ease phase and delay-matching of reference and coupling signal branches.

In some examples, the disclosed LO distribution system may be used for distribution of LO signals between different equipment in the wireless communication device.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A system for distribution of a local oscillator (LO) signal, the system comprising:
   a plurality of phase-locked loop (PLL) modules coupled to each other in a one-way, circulant coupling topology;
   each PLL module being configured to:
      receive a reference clock signal and output an output LO signal;
      provide a local LO signal to an adjacent downstream PLL module in the circulant coupling topology, the local LO signal being a frequency divided version of the output LO signal;
      receive an adjacent LO signal from an adjacent upstream PLL module in the circulant coupling topology; and
      cause a phase of the output LO signal to be coherent with a phase of the reference clock signal and a phase of the adjacent LO signal, using a feedback loop.

2. The system of claim 1, further comprising:
   a reference clock source for providing the reference clock signal.

3. The system of claim 1, wherein at least one PLL module is further configured to:
   receive a phase shift signal indicating an additional phase shift; and
   output the output LO signal with the additional phase shift applied.

4. The system of claim 1, wherein each PLL module comprises:
   a first phase detector for generating a first error signal representing a first phase difference between the reference clock signal and the local LO signal;
   a second phase detector for generating a second error signal representing a second phase difference between the adjacent LO signal and the local LO signal; and
   an oscillator for generating the output LO signal, based on the first and second phase error signals.

5. The system of claim 4, wherein each PLL module further comprises:
   a charge pump for receiving a sum of the first and second phase error signals and outputting a charge pump output; and
   a low-pass filter for receiving the charge pump output and outputting an oscillator control signal to the oscillator.

6. The system of claim 5, wherein the oscillator is a voltage-controlled oscillator.

7. The system of claim 1, wherein each PLL module comprises:
   a frequency divider in the feedback loop, the frequency divider dividing a frequency of the output LO signal to generate the local LO signal that is fed back.

8. A wireless communication device comprising:
a plurality of antennas;
an antenna branch for each antenna, each antenna branch being configured to:
  receive a respective first signal; and
  mix the respective first signal with a respective local oscillator (LO) signal to generate a respective second signal; and
an LO distribution system for providing the LO signals to the antenna branches, the LO distribution system including:
  a plurality of phase-locked loop (PLL) modules coupled to each other in a one-way, circulant coupling topology;
  each PLL module being configured to:
    receive a reference clock signal and output one respective LO signal;
    provide a local LO signal to an adjacent downstream PLL module in the circulant coupling topology, the local LO signal being a frequency divided version of the respective LO signal;
    receive an adjacent LO signal from an adjacent upstream PLL module in the circulant coupling topology; and
    cause a phase of the respective LO signal to be coherent with a phase of the reference clock signal and a phase of the adjacent LO signal, using a feedback loop.

9. The wireless communication device of claim 8, wherein the plurality of antenna branches are operating in transmitting mode, wherein the respective first signal is a respective intermediate frequency (IF) signal and the respective second signal is a respective carrier signal, and wherein each antenna branch is further configured to provide the respective carrier signal to the respective antenna for transmission.

10. The wireless communication device of claim 8, wherein the plurality of antenna branches are operating in receiving mode, wherein the respective first signal is a respective carrier signal and the respective second signal is a respective intermediate frequency (IF) signal, and wherein each antenna branch is further configured to receive the respective carrier signal from the respective antenna.

11. The wireless communication device of claim 8, wherein the LO distribution system further comprises:
  a reference clock source for providing the reference clock signal.

12. The wireless communication device of claim 8, wherein at least one PLL module of the LO distribution system is further configured to:
  receive a phase shift signal indicating an additional phase shift; and
  output the respective LO signal with the additional phase shift applied.

13. The wireless communication device of claim 10, further comprising a processor configured to provide the phase shift signal to the LO distribution system.

14. The wireless communication device of claim 10, wherein the plurality of antennas form an antenna array, wherein each PLL module of the LO distribution system receives a respective phase shift signal indicating a respective additional phase shift, the respective additional phase shifts being used for beamforming or beam steering by the antenna array.

15. The wireless communication device of claim 8, wherein each PLL module comprises:
  a first phase detector for generating a first error signal representing a first phase difference between the reference clock signal and the local LO signal;
  a second phase detector for generating a second error signal representing a second phase difference between the adjacent LO signal and the local LO signal; and
  an oscillator for generating the respective LO signal, based on the first and second phase error signals.

16. The wireless communication device of claim 15, wherein each PLL module further comprises:
  a charge pump for receiving a sum of the first and second phase error signals and outputting a charge pump output; and
  a low-pass filter for receiving the charge pump output and outputting an oscillator control signal to the oscillator.

17. The wireless communication device of claim 16, wherein the oscillator is a voltage-controlled oscillator.

18. The wireless communication device of claim 8, wherein each PLL module comprises:
  a frequency divider in the feedback loop, the frequency divider dividing a frequency of the respective LO signal to generate the local LO signal that is fed back.

19. The wireless communication device of claim 8, wherein the plurality of antennas are configured for multiple-input multiple-output (MIMO) communications.

20. The wireless communication device of claim 8, wherein the plurality of antennas are configured for millimeter wave communications.

* * * * *